United States Patent
Komada

(10) Patent No.: US 6,787,474 B2
(45) Date of Patent: Sep. 7, 2004

(54) MANUFACTURE METHOD FOR SEMICONDUCTOR DEVICE HAVING SILICON-CONTAINING INSULATING FILM

(75) Inventor: Daisuke Komada, Kasugai (JP)

(73) Assignee: Fujitsu Limited, Kawasaki (JP)

(*) Notice: Subject to any disclaimer, the term of this patent is extended or adjusted under 35 U.S.C. 154(b) by 9 days.

(21) Appl. No.: 10/040,378

(22) Filed: Jan. 9, 2002

(65) Prior Publication Data
US 2003/0064603 A1 Apr. 3, 2003

(30) Foreign Application Priority Data
Sep. 28, 2001 (JP) .................................. 2001-300562

(51) Int. Cl.$^7$ ........................................... H01L 21/302
(52) U.S. Cl. ..................... 438/706; 438/710; 438/712; 438/720; 216/58; 216/67
(58) Field of Search ............................ 438/700, 706, 438/710, 712, 720, 584; 216/58, 67

(56) References Cited

U.S. PATENT DOCUMENTS

| | | | | | |
|---|---|---|---|---|---|
| 5,338,399 | A | * | 8/1994 | Yanagida | 156/345 |
| 5,503,901 | A | * | 4/1996 | Sakai et al. | 428/161 |
| 6,380,096 | B2 | * | 4/2002 | Hung et al. | 438/723 |

FOREIGN PATENT DOCUMENTS

| JP | 3038950 | 3/2000 |
|---|---|---|
| JP | 2-2000-299380 | 10/2000 |
| JP | A-2001-110790 | 4/2001 |

* cited by examiner

*Primary Examiner*—Lan Vinh
(74) *Attorney, Agent, or Firm*—Arent Fox, PLLC

(57) ABSTRACT

The surface of an insulating film made of silicon-containing insulating material is covered with a mask pattern. The insulating film is dry-etched by using the mask pattern as a mask and etching gas which contains $C_4F_8$ gas and $C_xF_y$ gas (wherein x and y are an integer and satisfy $x \geq 5$ and $y \leq (2x-1)$). In the dry-etching process, a sufficient etching selection ratio can be obtained between a layer to be etched and an underlying etching stopper film.

14 Claims, 8 Drawing Sheets

MANUFACTURE METHOD FOR SEMICONDUCTOR DEVICE HAVING SILICON-CONTAINING INSULATING FILM

CROSS REFERENCE TO RELATED APPLICATION

This application is based on Japanese patent application 2001-300562, filed on Sep. 28, 2001, the whole contents of which are incorporated herein by reference.

BACKGROUND OF THE INVENTION

A) Field of the Invention

The present invention relates to a manufacture method for semiconductor devices, and more particularly to a semiconductor device manufacture method having a process of dry-etching a silicon-containing insulating film by using the underlying film as an etching stopper film.

B) Description of the Related Art

In order to connect wiring patterns formed on an interlayer insulating film to the source/drain regions of MOSFET covered with the interlayer insulating film, contact holes are formed through the interlayer insulating film. Generally, there is dispersion of thicknesses of interlayer insulating films. Contact holes for the source/drain regions and a contact hole for the gate electrode are formed at the same time in some cases. An interlayer insulating film formed on the source/drain regions is usually thicker than an interlayer insulating film on the gate electrode.

An over-etch is usually performed in order to form a contact even through a thick region of an interlayer insulating film with good reproductivity. In order to prevent damages of the source/drain regions to be caused by over-etch, an etching stopper made of material having an etching rate slower than an interlayer insulating film is disposed on the surface of an underlying film of the interlayer insulating film. If the interlayer insulating film is made of silicon oxide ($SiO_2$), the etching stopper film is made of, for example, silicon nitride (SiN).

Since the patterns of semiconductor integrated circuit devices are becoming finer, contact holes are formed in a self alignment manner (Self-Aligned contact: SAC). With this SAC method, the side walls and upper surface of a gate electrode are covered with an etching stopper film, and an interlayer insulating film is formed on the etching stopper film. The etching stopper film protects the gate electrode while contact holes are formed through the interlayer insulating film to expose the surfaces of the source/drain regions, so that the gate electrode is prevented from being exposed.

When a multi-layer wiring structure of Al wiring patterns is formed, an antioxidation TiN film or antireflection SiON film is formed on an Al wiring layer. While via holes are formed through an interlayer insulating film, this TiN film or SiON film functions as an etching stopper film.

In order to stop etching at such an etching stopper film with good reproductivity, it is necessary to obtain a high etching rate ratio (selection ratio) between the interlayer insulating film and etching stopper film. Conventionally, carbon monoxide (CO) is added to $C_4F_8$ to realize a high selection ratio.

Techniques of forming a Cu wiring by a damascene method has recently been used in order to lower a wiring resistance and improve the performance of the semiconductor device. With a single damascene method, a via layer insulating film is formed on an underlying Cu wring, and a via hole is formed through this via layer insulating film. After the via hole is formed, the resist pattern used as an etching mask is ashed and removed by using oxygen plasma.

If the underlying Cu wiring is exposed while the resist pattern is ashed, the Cu wiring is oxidized. In order to avoid this, the upper surface of the Cu wiring is usually protected by an antioxidation film made of silicon nitride or the like. While the antioxidation film is left on the bottom of the via hole, the resist pattern is ashed. This antioxidation film also functions as an etching stopper film while the via hole is formed. After the resist pattern is removed, the antioxidation film left on the bottom of the via hole is etched to expose the Cu wiring.

Instability of an etching system, dispersion of thicknesses of interlayer insulating films, variation in etching rates in the whole area of a substrate, and the like may result in over-etch while via holes are formed. An etching rate of a via hole having a high aspect ratio becomes slow because of the micro loading effect.

An antimoisture ring made of metal is usually disposed around the outer peripheral area of a chip. At the same time when a via hole is formed, a groove pattern for disposing an antimoisture ring is formed in the outer peripheral area of the chip. This groove pattern has an aspect ratio lower than that of the via hole so that the etching rate of the groove pattern becomes faster than that of the via hole. An over-etch amount of the groove pattern becomes therefore large.

Wiring groove patterns to be formed by the damascene method have various sizes and aspect ratios. A large over-etch occurs in a groove pattern having a relatively large aspect ratio.

In order to leave an antioxidation film with good reproductivity on the bottom of a via hole or groove pattern which may be subjected to large over-etch, the via hole or groove pattern is required to be formed under the etching conditions of a large selection ratio between a via layer insulating film or wiring layer insulating film and the etching stopper film.

Conventional etching techniques cannot obtain a sufficiently high selection ratio so that an etching stopper film on the bottom of a via hole or groove pattern is likely to be etched and removed by over-etch and the Cu wiring is oxidized.

SUMMARY OF THE INVENTION

It is an object of the present invention to provide a method of manufacturing a semiconductor device by utilizing dry etching techniques capable of obtaining a sufficiently high selection ratio between a layer to be etched and an underlying etching stopper film.

According to one aspect of the present invention, there is provided a method of manufacturing a semiconductor device, comprising: a step of covering a surface of an insulating film made of silicon-containing insulating material with a mask pattern, the insulating film being formed on a surface of a semiconductor substrate; and a step of dry-etching the insulating film by using the mask pattern as a mask and etching gas which contains $C_4F_8$ gas and $C_xF_y$ gas (wherein x and y are an integer and satisfy $x \geq 5$ and $y \leq (2x-1)$).

An etching selection ratio of the insulating film to the etching stopper film under the insulating film can be raised by using the etching gas which contains $C_4F_8$ gas and $C_xF_y$ gas (wherein x and y are an integer and satisfy $x \geq 5$ and $y \leq (2x-1)$).

According to another aspect of the present invention, there is provided a method of manufacturing a semiconductor device, comprising: a step of preparing a semiconductor substrate having a metal wiring whose upper surface is exposed on a surface of the semiconductor substrate; a step of forming an etching stopper film made of a first insulating material on the surface of the semiconductor substrate; a step of depositing an insulating film on the etching stopper film, the insulating film being made of a second insulating material which contains Si and has an etching resistance different from the etching stopper film; a step of covering a surface of the insulating film with a resist pattern having an opening superposed upon the metal wiring; a step of dry-etching the insulating film by using the mask pattern as a mask and etching gas which contains $C_4F_8$ gas and $C_xF_y$ gas (wherein x and y are an integer and satisfy $x \geq 5$ and $y \leq (2x-1)$), to form a recess and expose the etching stopper film on a bottom of the recess; a step of removing the resist pattern under a condition that the metal wiring is covered with the etching stopper film; a step of removing the etching stopper film exposed at the dry-etching step; and a step of burying conductive material in the recess etched by the dry-etching step to form a conductive member connected to the metal wiring, wherein an etching rate of the first insulating material is slower than an etching rate of the second insulating material when the dry-etching step is performed by the etching gas.

Since the etching selection ratio of the insulating film to the etching stopper film can be raised, the etching stopper film can be left on the bottom of the recess with good reproductivity. It is therefore possible to prevent oxidation of the metal wiring when the resist pattern is removed.

DETAILED DESCRIPTION OF THE PREFERRED EMBODIMENTS

Figure 1:
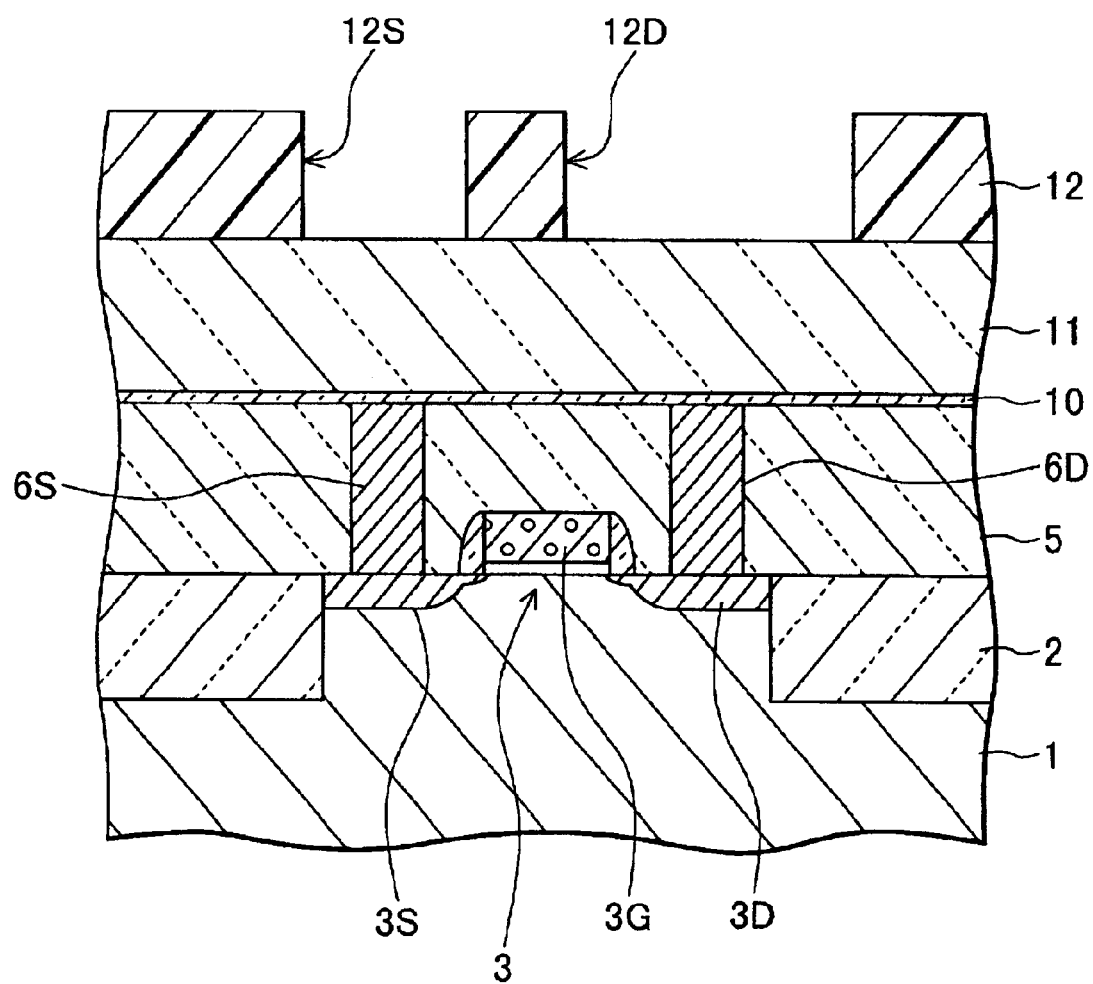
FIGS. 1 to 3 are cross sectional views illustrating a semiconductor device manufacturing method according to a first embodiment of the invention.
Figure 2:
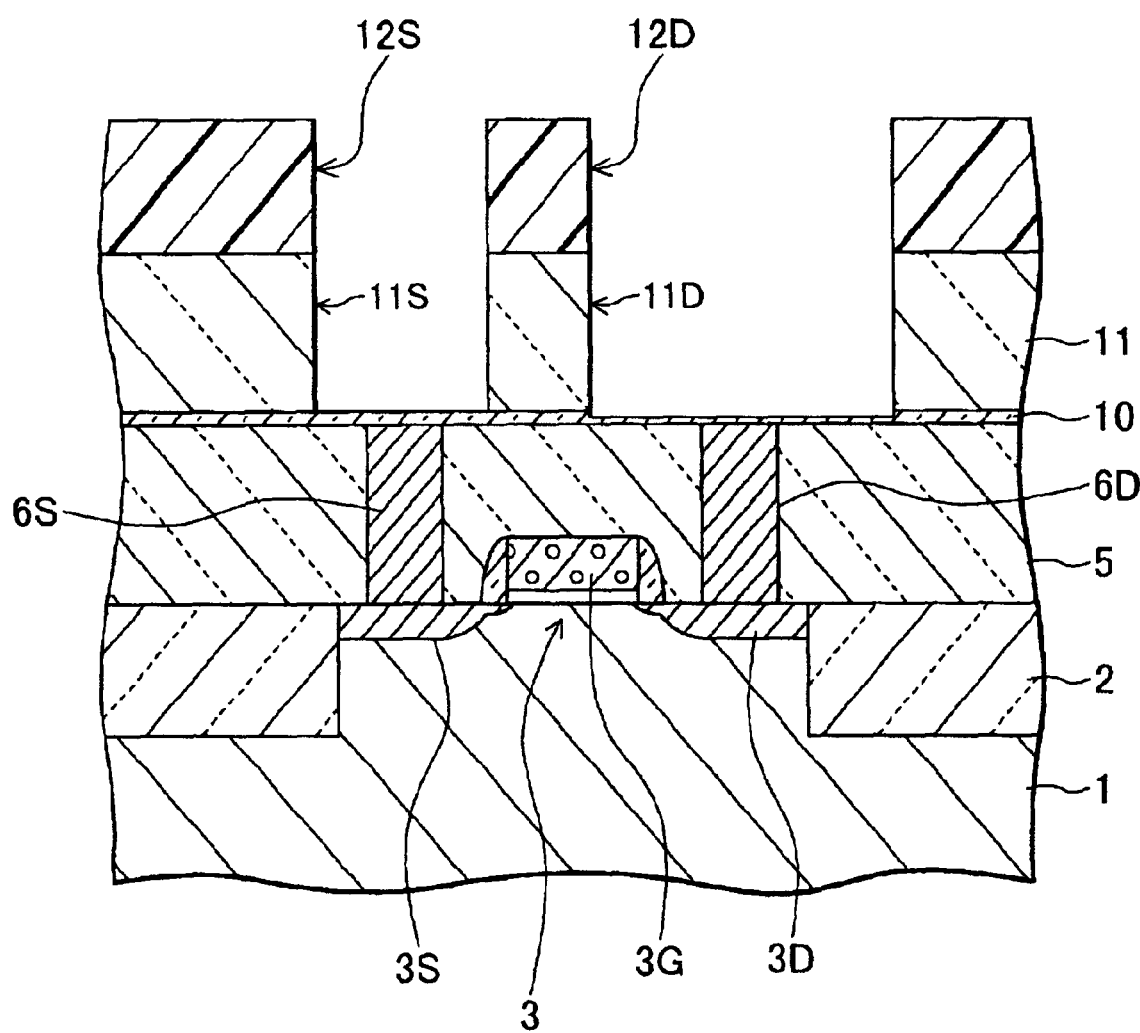
Figure 3:
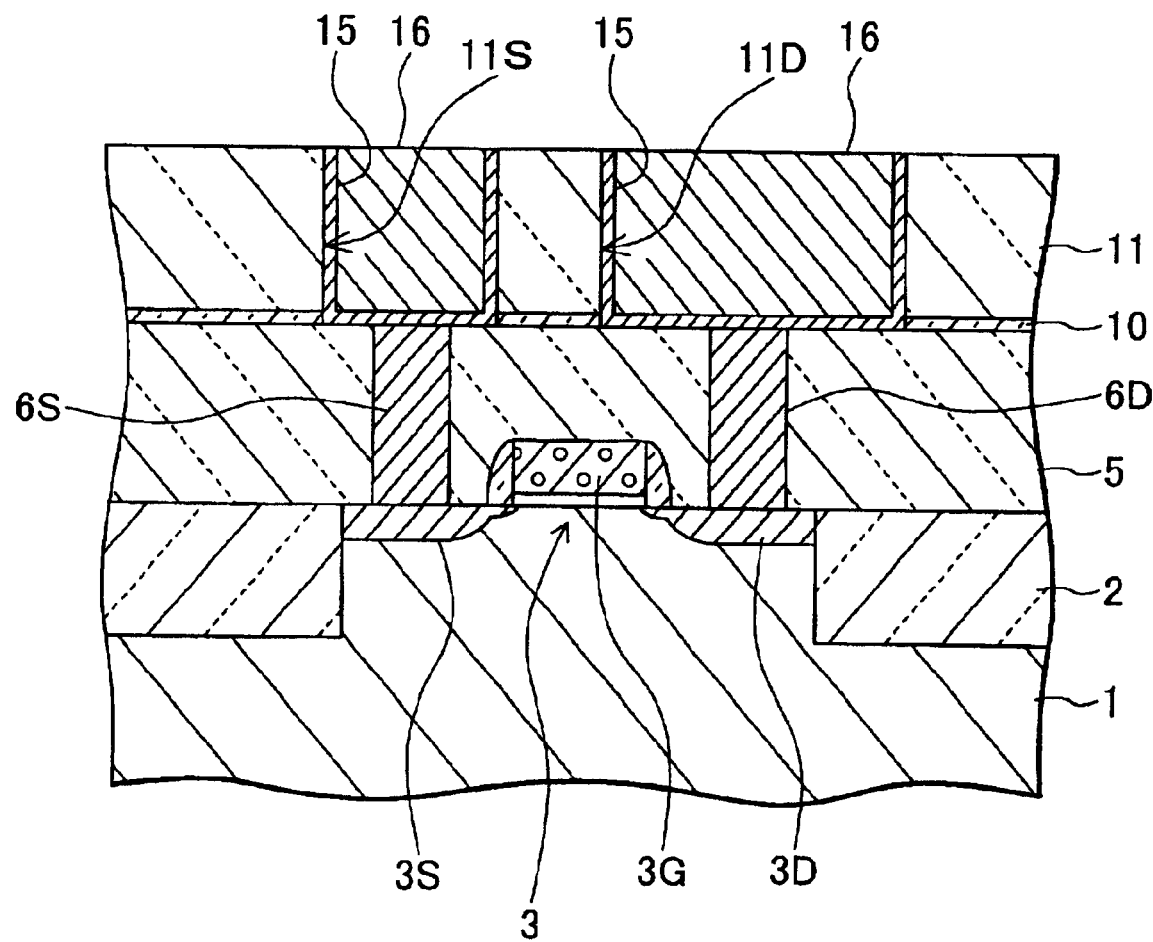

With reference to FIGS. 1 to 3, a semiconductor device manufacturing method according to a first embodiment of the invention will be described.

As shown in FIG. 1, in the surface layer of a silicon substrate 1, an element separation insulating region 2 is formed to define active regions. The element separation insulating region 2 is formed by local oxidation of silicon (LOCOS), shallow trench isolation (STI) or the like. A MOSFET 3 is formed in the active region. MOSFET 3 has a gate electrode 3G, a source region 3S and a drain region 3D.

An interlayer insulating film 5 of silicon oxide ($SiO_2$) is formed on the silicon substrate 1, covering MOSFET 3. For example, the interlayer insulating film 5 is formed by chemical vapor deposition (CVD). A plurality of via holes are formed through the interlayer insulating film 5, and plugs made of tungsten (W) are filled in the via holes. Plugs 6S and 6D are connected to the source region 3S and drain region 3D, respectively. A barrier metal layer of TiN or the like is formed in the inner wall of each via hole.

An etching stopper film 10 of SiN having a thickness of 30 nm is formed on the interlayer insulating film 5. For example, the etching stopper film 10 can be formed by plasma enhanced CVD. A wiring layer insulating film 11 of fluorosilicate glass (FSG) having a thickness of 500 nm is formed on the etching stopper film 10. For example, the wiring layer insulating film 11 can be formed by plasma CVD by using $SiH_4$, $SiF_4$, $N_2O$ and $N_2$ as source gasses.

A resist film 12 is formed on the wiring layer insulating film 11. By utilizing photolithography techniques, an elongated opening 12S passing above the plug 6S and an elongated opening 12D passing above the plug 6D are formed through the resist film 12. A width of the opening is about 0.25 $\mu$m and a width of the opening 12D is about 0.5 $\mu$m.

As shown in FIG. 2, by using the resist film 12 as a mask, the wiring layer insulating film 11 is etched to form wiring grooves 11S and 11D corresponding to the openings 12S and 12D. The wiring layer insulating film 11 can be etched by reactive ion etching (RIE). In this embodiment, an RIE system (UNITY 85-IEM) manufactured by Tokyo Electron Limited was used. The detailed etching conditions will be later described.

Because of the micro loading effect, the wider groove 11D is etched faster than the narrower groove 11S. Therefore, if the etching is stopped when the etching stopper film 10 is exposed on the bottom of the narrower groove 11S, the upper layer of the etching stopper film 10 on the bottom of the wider groove 11D is etched. After the wiring grooves 11S and 11D are formed, the resist film 12 is ashed and removed and thereafter, the etching stopper film 10 exposed on the bottoms of the grooves 11S and 11D is etched by using mixture gas of $CHF_3$ and $O_2$.

Processes up to the structure shown in FIG. 3 will be described. The inner walls of the wiring grooves 11S and 11D and the surface of the wiring layer insulating film 11 are covered with a barrier metal layer 15 made of Ta or the like. On the surface of the barrier metal layer 15, a seed layer of Cu is formed and a Cu film is filled in the wiring grooves 11S and 11D by plating. Unnecessary regions of the Cu film and barrier metal layer are removed by chemical mechanical polishing (CMP). The upper surface of the wiring layer insulating film 11 is therefore exposed and Cu wiring patterns 16 buried in the wiring grooves 11S and 11D are left.

Figure 4:
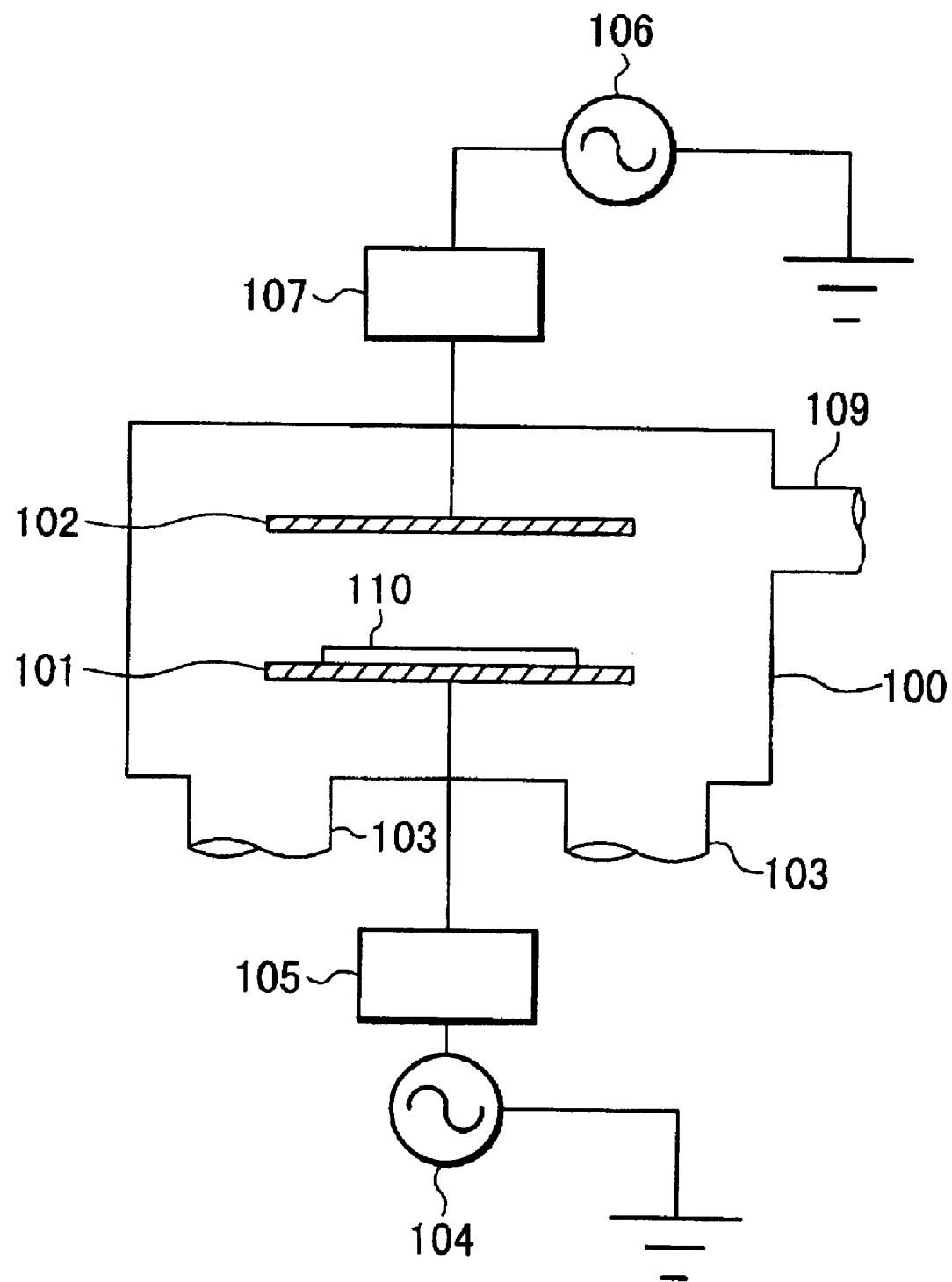
FIG. 4 is a schematic diagram showing an RIE system used by the embodiment method of the invention.

FIG. 4 is a schematic diagram showing the structure of an RIE system. In a chamber 100, a lower electrode 101 and an upper electrode 102 are disposed generally in parallel. Etching gas is introduced via a gas inlet port 109 into the chamber 100, whereas unreacted etching gas and reaction byproducts are drained from an air outlet port 103. A power source 106 applies a high frequency voltage of 27 MHz to the upper electrode 102 via an impedance matching circuit 107. A bias power source 104 applies a high frequency voltage of 800 kHz to the lower electrode 101 via an impedance matching circuit 105. A substrate 110 to be processed is placed on the lower electrode 101.

Next, the etching conditions of the wiring layer insulating film 11 shown in FIG. 2 will be described. Etching gasses used were cyclic and saturated $C_4F_8$ and chained and unsaturated $C_5F_8$, Ar, CO and $O_2$ at flow rates of 6 sccm, 4 sccm, 300 sccm, 100 sccm, and 10 sccm, respectively. A pressure in the chamber 100 was 5.3 Pa (40 mTorr), a source power supplied to the upper electrode 102 was 600 W, a bias power supplied to the lower electrode 101 was 1400 W, and a temperature of the lower electrode 101 was 20° C.

Under these etching conditions, a ratio (selection ratio) of an etching rate of the FSG film to an etching rate of the SiN film was about 20. An etching rate of the narrower groove 11S was about 400 nm/min and that of the wider groove 11D was about 500 nm/min. In order to expose the etching stopper film 10 on the bottom of the narrower groove 11S with good reproductivity, an over-etch of 20% was performed. Namely, the etching time was set to a time of 90 seconds which forms the narrower groove 11S having a depth of 600 nm at its etching rate (1.2×500 nm thickness of the wiring layer insulating film 11).

An over-etch corresponding to a thickness of 100 nm (600 nm–500 nm) is therefore performed at the bottom of the narrower groove 11S. This over-etch etches the etching stopper film 10 exposed on the bottom of the narrower groove 11S by a depth of 5 nm (100 nm×1/20).

Etching the wider groove 11D at its etching rate for 90 seconds corresponds to an etching amount of 750 nm. Since the thickness of the wiring layer insulating film 11 is 500 nm, an over-etch amount is 250 nm. This over-etch corresponds to an etch amount of 12.5 nm of the etching stopper film 10 exposed on the bottom of the wider groove 11D, because the selection ratio of the FSG film to the SiN film is 20.

Since the thickness of the etching stopper film 10 is 30 nm, an etching stopper film 10 having a sufficient thickness can be left also on the bottom of the wider groove 11D. It is therefore possible to prevent the plugs 6S and 6D under the etching stopper film 10 from being etched.

For comparison, etching was performed without adding $C_5F_8$ gas to the etching gasses. The etching gasses used were cyclic and saturated $C_4F_8$, Ar, CO and $O_2$ at the flow rates of 10 sccm, 200 sccm, 75 sccm and 6 sccm, respectively. A pressure in the chamber was 8 Pa (60 mTorr), a source power was 600 W, a bias power was 1300 W, and a lower electrode temperature was 20° C.

Under these etching conditions, the etching selection ratio was 8. If the narrower groove 11S is over-etched by 20% under these etching conditions, the etching stopper film 10 on the bottom of the wider groove 11D is etched by about 31.3 nm. Since the thickness of the etching stopper film 10 is 30 nm, the plug 6D is exposed on the bottom of the wider groove 11D and the plug 6D is partially etched.

It can be considered from this comparison that $C_5F_8$ in the etching gasses increases the etching selection ratio. It is known that the etching selection ratio can be increased by adding CO gas. However, addition of CO gas only is insufficient, and if $C_5F_8$ is added, the selection ratio can be increased further. $O_2$ gas has a function of improving clearance quality of etching. Ar gas is used for ion assistance.

Next, with reference to FIGS. 5A to 5D, a semiconductor device manufacture method according to a second embodiment of the invention will be described.

Figure 5A:
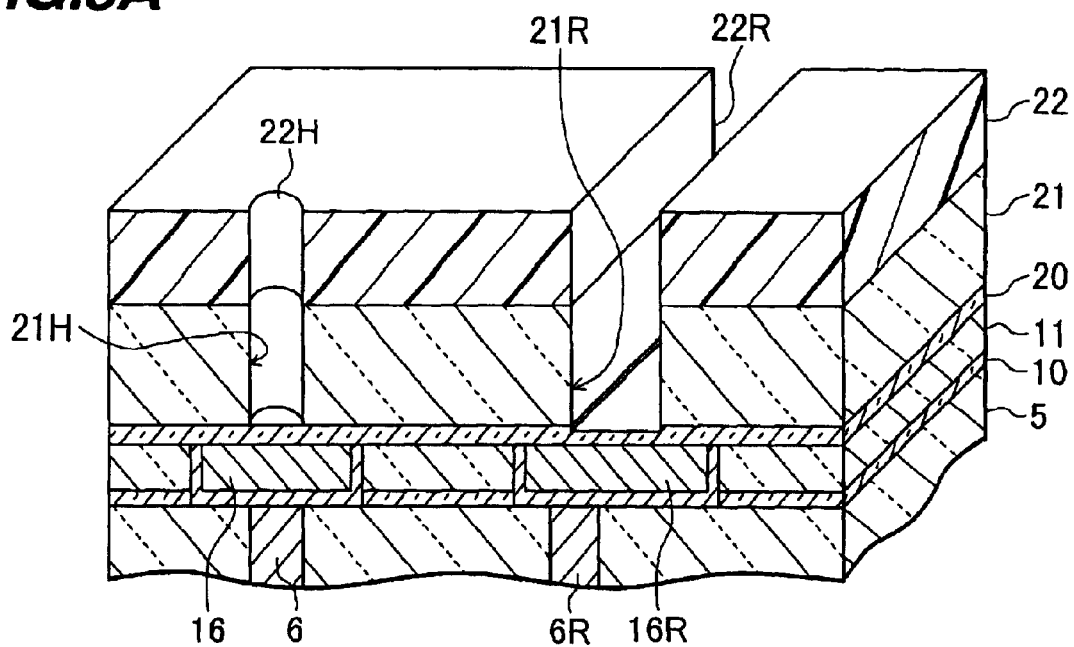
FIGS. 5A to 5D are partially broken perspective views illustrating a semiconductor device manufacturing method according to a second embodiment of the invention.

As shown in FIG. 5A, a Cu wiring 16 is buried in a wiring groove formed through a wiring layer insulating film 11. The wiring layer insulating film 11 and its underlying structure are formed by a method similar to that of the first embodiment. Moisture proof rings 6R and 16R are formed slightly inside the outer periphery of a chip and along the chip outer periphery. The moisture proof ring 6R is formed by the same process as the process of forming a tungsten plug 6, and the moisture proof ring 16R is formed by the same process as the process of forming the Cu wiring 16.

An etching stopper film 20 of silicon nitride having a thickness of 50 nm is formed on the wiring layer insulating film 11. The etching stopper film 20 is formed, for example, by plasma enhanced CVD and functions as a diffusion preventing and antioxidation film for the Cu wiring 16. On this etching stopper film 20, a via layer insulating film 21 of FSG having a thickness of 1000 nm is formed. For example, the via layer insulating film 21 is formed by plasma enhanced CVD.

A resist film 22 is formed on the via layer insulating film 21. An opening 22H for forming a via hole and an opening 22R for forming a moisture proof ring are formed through the resist film 22. The opening 22H is disposed superposing upon the Cu wiring 16 and the opening 22R is disposed above the moisture proof ring 16R and along this ring.

By using the resist film 22 as a mask, the via layer insulating film 21 is etched. The detailed etching conditions will be later described. A via hole 21H corresponding to the opening 22H and a groove 21R corresponding to the opening 22R are therefore formed. The etching stopper film 20 is exposed on the bottoms of the via hole 21H and groove 21R.

Figure 5B:
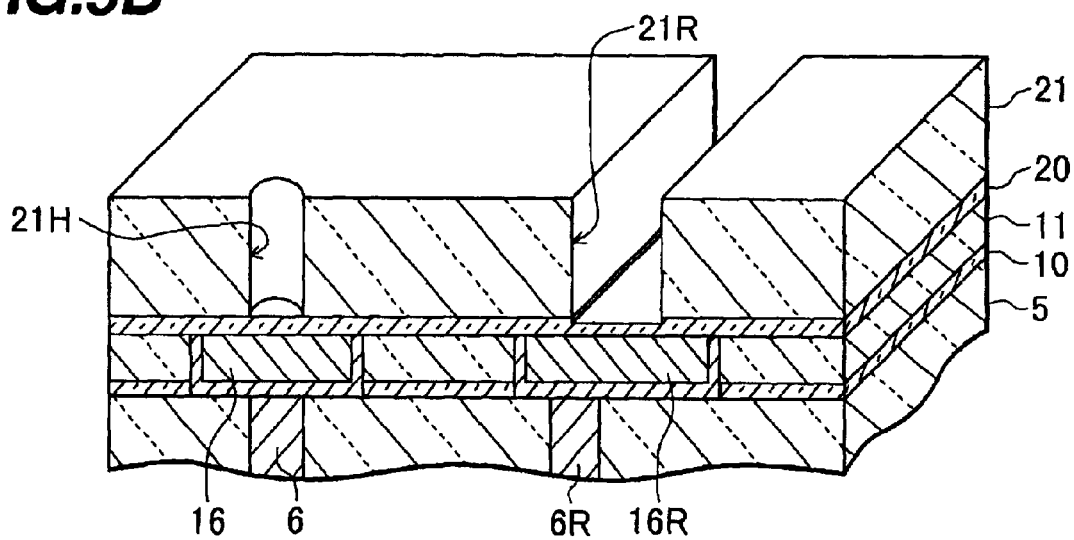

As shown in FIG. 5B, the resist film 22 is ashed and removed. At this time, since the upper surfaces of the Cu wiring 16 and moisture proof ring 16R are covered with the etching stopper film 20, it is possible to prevent oxidation of the Cu wiring 16 and moisture proof ring 16R.

Figure 5C:
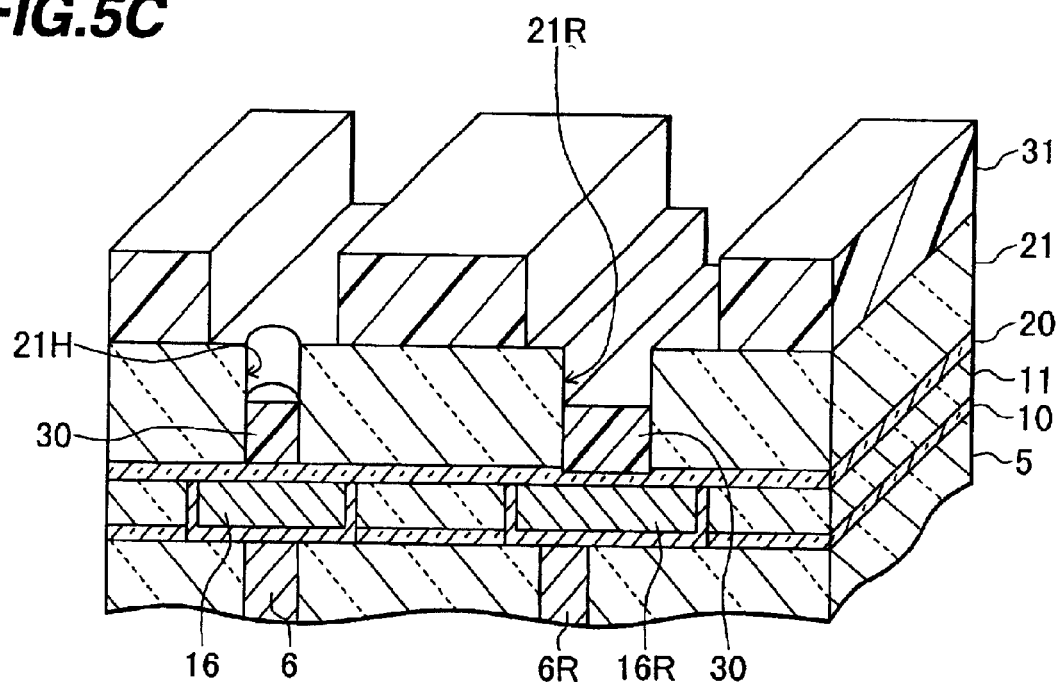

As shown in FIG. 5C, organic material 30 is buried in the via hole 21H and groove 21R to set the depths of the hole and groove to 500 nm or shallower. For example, the organic material 30 is resist from which photosensitive agent was removed. A resist film 31 is formed on the via layer insulating film 21, the resist film 31 having openings overlapping the via hole 21H and groove 21R.

By using the resist mask 31, the via layer insulating film 21 is etched. Since the etching stopper film 20 is protected by the organic material 30, the etching stopper film 20 is not etched. The resist film 31 is thereafter ashed and removed. At this time, the organic material 30 is also removed.

Figure 5D:
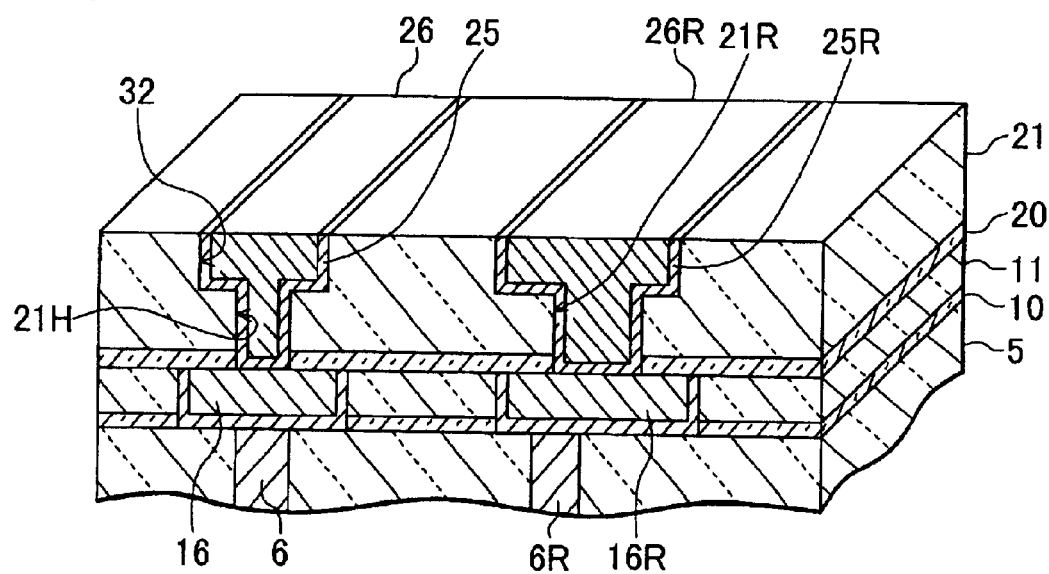

As shown in FIG. 5D, a wiring groove 32 continuous at its bottom with the via hole 21H is therefore formed. The width of the upper portion of the groove 21R is widened. Thereafter, the etching stopper film 20 exposed at the bottoms of the via hole 21H and groove 21R is etched by using mixture gas of $CHF_3$ and $O_2$.

The Cu wiring 16 and moisture proof ring 16R are exposed at the bottoms of the via hole 21H and groove 21R. Similar to the method described with reference to FIG. 3, a barrier metal layer and a seed layer are formed, a Cu film is buried and then CMP is performed. A barrier metal layer 25 is therefore formed in the inner walls of the via hole 21H and wiring groove 32, and a Cu wiring 26 is buried in the via hole 21H and wiring groove 32. A barrier layer 25R is also formed on the inner wall of the groove 21R, and the inside of the groove 21R is buried with a moisture proof ring 26R of Cu.

In the above manner, the copper wiring pattern is formed by the dual damascene method. By repeating a similar dual damascene method, a multi-layer wiring structure can be formed.

Next, the etching conditions of the via layer wiring film 21 shown in FIG. 5A will be described. Etching gasses used were cyclic and saturated $C_4F_8$ and chained and unsaturated $C_5F_8$, Ar, Co and $O_2$ at flow rates of 8 sccm, 3 sccm, 320 sccm, 190 sccm, and 8 sccm, respectively. A pressure in the chamber 100 was 4 Pa (30 mTorr), a source power supplied to the upper electrode 102 was 1750 W, a bias power supplied to the lower electrode 101 was 1400 W, and a temperature of the lower electrode 101 was 20° C.

Under these etching conditions, a ratio (selection ratio) of an etching rate of the FSG film to an etching rate of the SiN film was about 25. An etching rate of the via hole 21H having a diameter of 0.3 μm was about 500 nm/min and that of the groove 21R having a width of 0.3 μm was about 625 nm/min. In order to expose the etching stopper film 20 on the bottom of the via hole 21H with good reproductivity, an over-etch of 20% was performed. Namely, the etching time was set to a time of 144 seconds which forms the via hole 21H having a depth of 1200 nm at its etching rate (1.2×1000 nm thickness of the via layer insulating film 21).

An over-etch corresponding to a thickness of 200 nm (1200 nm–1000 nm) is therefore performed at the bottom of the via hole 21H. This over-etch etches the etching stopper film 20 exposed on the bottom of the via hole 21H by a depth of 8 nm (200 nm×½5).

Etching the groove 21R at its etching rate for 144 seconds corresponds to an etching amount of 1500 nm. Since the thickness of the wiring layer insulating film 11 is 1000 nm, an over-etch amount of the groove 21R is 500 nm. This over-etch corresponds to an etch amount of 20 nm (500 nm×½5) of the etching stopper film 20 exposed on the bottom of the groove 21R, because the selection ratio of the FSG film to the SiN film is 25.

Since the thickness of the etching stopper film 20 is 50 nm, an etching stopper film 20 having a sufficient thickness can be left also on the bottom of the groove 21R. It is therefore possible to prevent the Cu wiring 16 and moisture proof ring 16R under the etching stopper film 20 from being exposed.

For comparison, an FSG film was etched without adding $C_5F_8$ gas to the etching gasses. The etching gasses used were cyclic and saturated $C_4F_8$, Ar, CO and $O_2$ at the flow rates of 10 sccm, 200 sccm, 150 sccm and 6 sccm, respectively. A pressure in the chamber was 4 Pa (30 mTorr), a source power was 2000 W, a bias power was 1400 W, and a lower electrode temperature was 20° C.

Under these etching conditions, the etching selection ratio was 10. If the via hole 21H is over-etched by 20% under these etching conditions, the etching stopper film 20 on the bottom of the groove 21R is etched by about 50 nm. Since the thickness of the etching stopper film 20 is 50 nm, the moisture proof ring 16R is exposed on the bottom of the groove 21R. Therefore, the moisture proof ring 16R is oxidized while the resist film 22 shown in FIG. 5A is ashed.

It can be considered that the etching stopper film 20 is made thick to prevent exposure of the moisture proof ring 16R. However, the etching stopper film 20 of SiN has a higher dielectric constant than the via layer insulating film 21 of FSG. If the etching stopper 20 is made thick, a parasitic capacitance between wirings is increased, which is undesirable. As in the above embodiment, the etching selection ratio becomes high by adding chained and unsaturated $C_5F_8$ gas to cyclic and saturated $C_4F_8$ gas so that the etching stopper film can be made thin.

Next, with reference to FIG. 6, an optimum value of the content of the chained and unsaturated $C_5F_8$ gas will be described.

Figure 6:
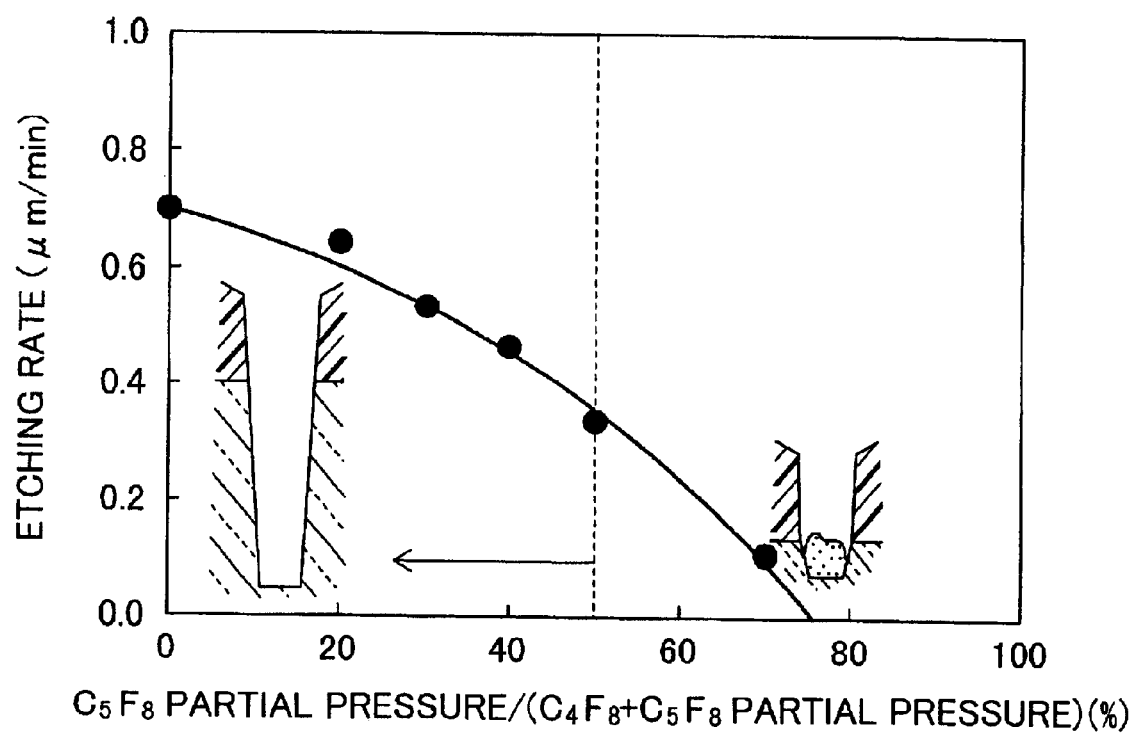
FIG. 6 is a graph showing a relation between a content of $C_5F_8$ gas and an etching rate.

The abscissa of the graph shown in FIG. 6 represents a ratio of a partial pressure of $C_5F_8$ gas to a ratio of a sum of partial pressures of $C_4F_8$ and $C_5F_8$ gas in the unit of "%", and the ordinate represents an etching rate of an FSG film in the unit of "μm/min". As the partial pressure of $C_5F_8$ gas is made large, the etching rate lowers. As the etching rate lowers, the etching selection ratio becomes high.

As the partial pressure ratio of $C_5F_8$ gas is made larger than 50%, reaction byproducts are left on the bottom of a via hole as drawn in the graph of FIG. 6. As the partial pressure ratio of $C_5F_8$ gas was made large, an amount of residue of reaction byproducts became large. As reaction byproducts are left on the bottom of the via hole, the etching progresses no more. As the partial pressure ratio of $C_5F_8$ gas was set to 0.5 or lower, residue of reaction byproducts was not formed. In order to prevent the formation of residue of reaction byproducts, it is preferable to set the partial pressure ratio of $C_5F_8$ to 0.5 or lower.

In the above embodiments, by using the SiN film as an etching stopper film, the FSG film on the SiN film is etched. A high etching selection ratio is expected also when Si containing insulating films (other than an SiN film and SiON film) are etched. For example, materials of such insulating films are silicon oxide ($SiO_2$), phosphosilicate glass (PSG), borosilicate glass (BSG), borophosphosilicate glass (BPSG), hydrogen silsesquioxane, tetraethylorthosilicate (TEOS), carbon containing silicon oxide (SiOC), spin-on-glass (SOG) and the like.

In the above embodiments, chained and unsaturated $C_5F_8$ gas is added to cyclic and saturated $C_4F_8$ gas, and these gasses are used as etching gasses. Other fluorocarbon gas of a similar kind may also be used. For example, in place of cyclic and saturated $C_4F_8$ gas, chained and unsaturated $C_4F_8$ gas may be used. In place of chained and unsaturated $C_5F_8$ gas, fluorocarbon gas expressed by a general formula $C_xF_y$ (where x and y are an integer and satisfy $x \geq 5$ and $y \leq (2x-1)$) may be used.

In place of chained and unsaturated $C_5F_8$ gas, $C_4F_6$ gas may be used. The $C_4F_6$ gas has a C/N ratio of 0.667 which is larger than the C/F ratio of 0.625 of the $C_5F_8$ gas, and vapor phase polymerization of the $C_4F_6$ gas is easier than the $C_5F_8$ gas. Since this difference is small, the optimum addition amount of the $C_4F_6$ gas to the $C_4F_8$ gas is generally the same as that of the $C_5F_8$ gas, although there is some difference between the amounts. Similar effects of adding the $C_5F_8$ are expected.

The etching method used by the above embodiments is applicable to manufacture of semiconductor devices of various structures, in addition to the embodiment structures. For example, this etching method can be applied to a process of forming via holes at the same time above the source region, gate electrode and drain region. The embodiment etching method is also applicable to a process of forming via holes in a self alignment manner above the source and drain regions after the upper and side walls of the gate electrode are covered with an etching stopper film. The embodiment etching method is also applicable to a process of forming via holes and wiring grooves by a single damascene method.

Figure 7A:
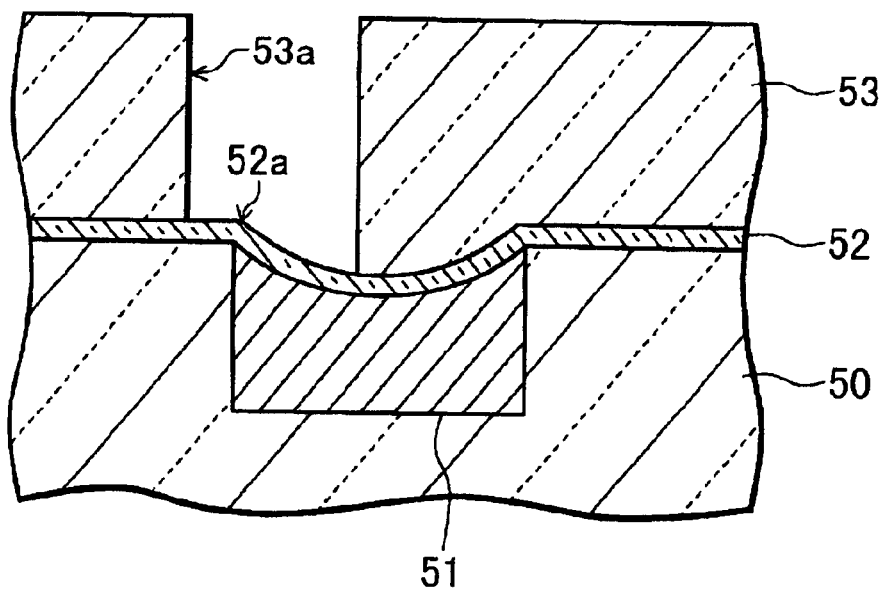
FIGS. 7A and 7B are cross sectional views illustrating semiconductor device manufacturing methods according to third and fourth embodiments of the invention, respectively.

FIG. 7A is a cross sectional view showing a via hole formed through an insulating film by a semiconductor device manufacture method according to a third embodiment. A copper wiring 51 is buried in a surface layer of an underlying interlayer insulating film 50. An etching stopper film 52 of SiN or SiC covers the surfaces of the copper wiring 51 and interlayer insulating film 50. An insulating film 53 made of the same material as that of the wiring layer insulating film 11 of the first embodiment shown in FIG. 1 is formed on the etching stopper film 52. A via hole 53a is formed through the insulating film 53. The via hole 53a is formed by a method similar to the method of forming the via hole 21H of the second embodiment shown in FIG. 5A.

The upper surface of the copper wiring 51 is usually depressed because of the characteristics inherent to CMP.

The etching stopper film 52 is formed conformal to this depressed surface. If the via hole 53a overlaps the edge of the copper wiring 51 because of an alignment position error, the projected area 52a of the etching stopper film 52 is exposed on the bottom of the via hole 53a. As the projected area 52a of the etching stopper film 52 is exposed, an etching selection ratio usually lowers.

If the via hole 53a is formed by the embodiment method, a high etching selection ratio can be obtained. Even if there is a position alignment error as shown in FIG. 7A, the etching can be stopped stably.

Figure 7B:
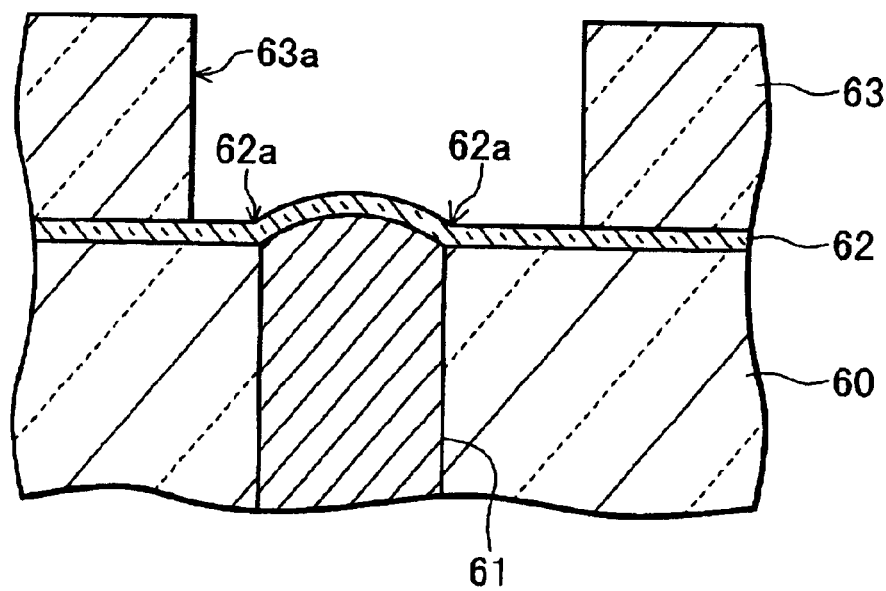

FIG. 7B is a cross sectional view showing a wiring groove formed through an insulating film by a semiconductor device manufacture method according to a fourth embodiment. A plug 61 of copper or tungsten is disposed in a surface layer of an underlying interlayer insulating film 60. An etching stopper film 62 of SiN or SiC is formed on the surfaces of the plug 61 and interlayer insulating film 60. An insulating film 63 made of the same material as that of the wiring layer insulating film 11 of the first embodiment shown in FIG. 1 is formed on the etching stopper film 62. A groove 63a is formed through the insulating film 63. The groove 63a is formed by a method similar to the method of forming the wiring groove 11S of the first embodiment shown in FIG. 2.

The upper surface of the plug 61 is usually projected. Therefore, a concave area 62a is likely to be formed along the boarder between the plug 61 and interlayer insulating film 60. If the wiring groove 63a is formed by the embodiment method, a high etching selection ratio can be obtained. Even if there is the concave area 62a as shown in FIG. 7B, the etching can therefore be stopped stably.

In the above-described embodiments, although the RIE system for generating capacity coupling plasma between two parallel plate electrodes is used, other dry etching systems may also be used such as an etching system for generating inductive coupled plasma (ICP) and an etching system for generating plasma by electron cyclotron resonance (ECR).

The present invention has been described in connection with the preferred embodiments. The invention is not limited only to the above embodiments. It is apparent that various modifications, improvements, combinations, and the like can be made by those skilled in the art.

What we claim are:

1. A method of manufacturing a semiconductor device, comprising the steps of:
   covering a surface of an insulating film made of silicon-containing insulating material with a mask pattern; and
   dry-etching the insulating film by using the mask pattern as a mask and etching gas which contains $C_4F_8$ gas and $C_xF_y$ gas (wherein x and y are an integer and satisfy $x \geq 5$ and $y \leq (2x-1)$;
   wherein the $C_xF_y$ gas is $C_5F_8$ gas and said dry-etching step is performed under a condition of $0 < P_2/(P_1+P_2) \leq 0.5$ where $P_1$ is a partial pressure of the $C_4F_8$ gas and $P_2$ is a partial pressure of the $C_5F_8$ gas.

2. A method of manufacturing a semiconductor device according to claim 1, wherein the $C_4F_8$ gas is cyclic and saturated fluorocarbon gas.

3. A method of manufacturing a semiconductor device according to claim 1, wherein the insulating film is made of at least one insulating material selected from the group consisting of silicon oxide, phosphosilicate glass, borosilicate glass, borophosphosilicate glass, fluorosilicate glass, hydrogen silsesquioxane, tetraethylorthosilicate, carbon containing silicon oxide, and spin-on-glass.

4. A method of manufacturing a semiconductor device according to claim 1, wherein the etching gas further contains at least one gas selected from the group consisting of argon, oxygen and carbon monoxide.

5. A method of manufacturing a semiconductor device according to claim 1, further comprising, before said step of covering the surface of the insulating film with the mask pattern, a step of forming an etching stopper film on the surface of a semiconductor substrate and forming the insulating film on the etching stopper film, the etching stopper film being made of material having an etching rate slower than an etching rate of the insulating film when said dry-etching process is performed by using the etching gas under a same etching condition.

6. A method of manufacturing a semiconductor device, comprising the steps of:
   preparing a semiconductor substrate having a metal wiring whose upper surface is exposed on a surface of the semiconductor substrate;
   forming an etching stopper film made of SiN or C on the surface of the semiconductor substrate;
   depositing an insulating film on the etching stopper film, the insulating film being made of a second insulating material which contains Si and has an etching resistance different from the etching stopper film;
   covering a surface of the insulating film with a resist pattern having an opening superposed upon the metal wiring;
   dry-etching the insulating film by using the mask pattern as a mask and etching gas which contains $C_4F_8$ gas and $C_xF_y$ gas (wherein x and y are an integer and satisfy $x \geq 5$ and $y \leq (2x-1)$, to form a recess and expose the etching stopper film on a bottom of the recess;
   removing the resist pattern under a condition that the metal wiring is covered with the etching stopper film;
   removing the etching stopper film exposed at said dry-etching step to expose a part of the metal wiring; and
   burying conductive material in the recess etched by said dry-etching step to form a conductive member connected to the metal wiring,
   wherein an etching rate of the first insulating material is slower than an etching rate of the second insulating material when said dry-etching step is performed bythe etching gas.

7. A method of manufacturing a semiconductor device according to claim 6, wherein the $C_4F_8$ gas is cyclic and saturated fluorocarbon gas.

8. A method of manufacturing a semiconductor device, comprising the steps of:
   preparing a semiconductor substrate having a metal wiring whose upper surface is exposed on a surface of the semiconductor substrate;
   forming an etching stopper film made of a first insulating material on the surface of the semiconductor substrate;
   depositing an insulating film on the etching stopper film, the insulating film being made of a second insulating material which contains Si and has an etching resistance different from the etching stopper film;
   covering a surface of the insulating film with a resist pattern having an opening superposed upon the metal wiring;
   dry-etching the insulating film by using the mask pattern as a mask and etching gas which contains $C_4F_8$ gas and $C_xF_y$ gas (wherein x and y are an integer and satisfy $x \geq 5$ and $y \leq (2x-1)$, to form a recess and expose the etching stopper film on a bottom of the recess;

removing the resist pattern under a condition that the metal wiring is covered with the etching stopper film;

removing the etching stopper film exposed at said dry-etching step to expose a part of the metal wiring; and burying conductive material in the recess etched by said dry-etching step to form a conductive member connected to the metal wiring, wherein an etching rate of the first insulating material is slower than an etching rate of the second insulating material when said dry-etching step is performed by the etching gas, wherein the $C_xF_y$ gas is $C_5F_8$ gas and said dry-etching step is performed under a condition of $0<P_2/(P_1+P_2)\leq0.5$ where $P_1$ is a partial pressure of the $C_4F_8$ gas and $P_2$ is a partial pressure of the $C_5F_8$ gas.

9. A method of manufacturing a semiconductor device according to claim 6, wherein the insulating film is made of at least one insulating material selected from the group consisting of silicon oxide, phosphosilicate glass, borosilicate glass, borophosphosilicate glass, fluorosilicate glass, hydrogen silsesquioxane, tetraethylorthosilicate, carbon containing silicon oxide, and spin-on-glass.

10. A method of manufacturing a semiconductor device, comprising the steps of:

forming a first film of SiN or SiC on an underlying layer formed with a copper wiring, a copper plug or a tungsten plug in a surface layer of the underlying layer;

forming a second film made of insulating material on the first film;

covering the second film with a mask pattern, and dry-etching the second film by using the mask pattern as a mask and etching gas which contains $C_4F_8$ gas and $C_xF_y$ gas (wherein x and y are an integer and satisfy $x\geq5$ and $y\leq(2x-1)$.

11. A method of manufacturing a semiconductor device according to claim 10, wherein the $C_4F_8$ gas is cyclic and saturated fluorocarbon gas.

12. A method of manufacturing a semiconductor device according to claim 10, wherein the second film is made of at least one insulating material selected from the group consisting of silicon oxide, phosphosilicate glass, borosilicate glass, borophosphosilicate glass, fluorosilicate glass, hydrogen silsesquioxane, tetraethylorthosilicate, carbon containing silicon oxide, and spin-on-glass.

13. A method of manufacturing a semiconductor device according to claim 10, wherein the etching gas further contains at least one gas selected from the group consisting of argon, oxygen and carbon monoxide.

14. A method of manufacturing a semiconductor device, comprising the steps of:

forming a first film of SiN or SiC on an underlying layer formed with a copper wiring, a copper plug or a tungsten plug in a surface layer of the underlying layer;

forming a second film made of insulating material on the first film;

covering the second film with a mask pattern, and dry-etching the second film by using the mask pattern as a mask and etching gas which contains $C_4F_8$ gas and $C_xF_y$ gas (wherein x and y are an integer and satisfy $x\geq5$ and $y\leq(2x-1)$, wherein the $C_xF_y$ gas is $C_5F_8$ gas and said dry-etching step is performed under a condition of $0<P_2/(P_1+P_2)\leq0.5$ where $P_1$ is a partial pressure of the $C_4F_8$ gas and $P_2$ is a partial pressure of the $C_5F_8$ gas.

* * * * *